United States Patent
Bi et al.

(10) Patent No.: US 11,011,622 B2
(45) Date of Patent: *May 18, 2021

(54) CLOSELY PACKED VERTICAL TRANSISTORS WITH REDUCED CONTACT RESISTANCE

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/666,590

(22) Filed: Oct. 29, 2019

(65) Prior Publication Data
US 2020/0066882 A1    Feb. 27, 2020

Related U.S. Application Data

(62) Division of application No. 16/023,244, filed on Jun. 29, 2018, now Pat. No. 10,535,755, which is a
(Continued)

(51) Int. Cl.
*H01L 29/66*      (2006.01)
*H01L 29/08*      (2006.01)
(Continued)

(52) U.S. Cl.
CPC .. *H01L 29/66666* (2013.01); *H01L 21/31116* (2013.01); *H01L 21/76816* (2013.01);
(Continued)

(58) Field of Classification Search
CPC ......... H01L 21/76816; H01L 21/31116; H01L 27/11273; H01L 27/11582; H01L 23/5226;
(Continued)

(56) References Cited

U.S. PATENT DOCUMENTS 6,707,095 B1    3/2004    Chidambarrao et al.
6,747,314 B2    6/2004    Sundaresan et al.
(Continued)

OTHER PUBLICATIONS

List of IBM Patents or Patent Applications Treated as Related (Appendix P); Date Filed Oct. 29, 2019, 2 pages.

*Primary Examiner* — Dao H Nguyen
(74) *Attorney, Agent, or Firm* — Cantor Colburn LLP; Randall Bluestone

(57) ABSTRACT

A method of forming a semiconductor device and resulting structures having closely packed vertical transistors with reduced contact resistance by forming a semiconductor structure on a doped region of a substrate, the semiconductor structure including a gate formed over a channel region of a semiconductor fin. A liner is formed on the gate and the semiconductor fin, and a dielectric layer is formed on the liner. Portions of the liner are removed to expose a top surface and sidewalls of the semiconductor fin and a sidewall of the dielectric layer. A recessed opening is formed by recessing portions of the liner from the exposed sidewall of the dielectric layer. A top epitaxy region is formed on the exposed portions of the semiconductor fin and dielectric layer such that an extension of the top epitaxy region fills the recessed opening. The top epitaxy region is confined between portions of the liner.

20 Claims, 11 Drawing Sheets

Related U.S. Application Data division of application No. 15/618,611, filed on Jun. 9, 2017, now Pat. No. 10,096,695, which is a division of application No. 15/248,355, filed on Aug. 26, 2016, now Pat. No. 9,735,253.

(51) Int. Cl.

| | | |
|---|---|---|
| *H01L 29/78* | (2006.01) | |
| *H01L 29/417* | (2006.01) | |
| *H01L 21/311* | (2006.01) | |
| *H01L 27/11582* | (2017.01) | |
| *H01L 27/112* | (2006.01) | |
| *H01L 21/768* | (2006.01) | |
| *H01L 23/522* | (2006.01) | |
| *H01L 23/485* | (2006.01) | |

(52) U.S. Cl.
CPC .... *H01L 23/5226* (2013.01); *H01L 27/11273* (2013.01); *H01L 27/11582* (2013.01); *H01L 29/0847* (2013.01); *H01L 29/41741* (2013.01); *H01L 29/41775* (2013.01); *H01L 29/6653* (2013.01); *H01L 29/7827* (2013.01); *H01L 23/485* (2013.01)

(58) Field of Classification Search
CPC ........... H01L 29/66666; H01L 29/6653; H01L 29/0847; H01L 29/7827; H01L 29/41741; H01L 29/41775

See application file for complete search history.

(56) References Cited

U.S. PATENT DOCUMENTS

| | | | |
|---|---|---|---|
| 7,176,089 B2 | 2/2007 | Furukawa et al. | |
| 7,592,218 B2 | 9/2009 | Brown | |
| 7,683,428 B2 | 3/2010 | Chidambarrao et al. | |
| 9,299,835 B1 | 3/2016 | Anderson et al. | |
| 9,318,581 B1 | 4/2016 | Guo et al. | |
| 9,318,583 B2 * | 4/2016 | Verhulst | H01L 29/66666 |
| 9,368,572 B1 | 6/2016 | Cheng et al. | |
| 9,397,094 B2 | 7/2016 | Cheng et al. | |
| 9,530,866 B1 * | 12/2016 | Zhang | H01L 29/0676 |
| 9,536,793 B1 * | 1/2017 | Zhang | H01L 21/823828 |
| 9,548,385 B1 | 1/2017 | Cheng et al. | |
| 9,570,552 B1 | 2/2017 | Lee et al. | |
| 9,735,253 B1 * | 8/2017 | Bi | H01L 29/0847 |
| 10,096,695 B2 * | 10/2018 | Bi | H01L 27/11582 |
| 2015/0255604 A1 | 9/2015 | Yang | |
| 2018/0012993 A1 | 1/2018 | Cheng et al. | |
| 2018/0061967 A1 | 3/2018 | Bi et al. | |
| 2018/0323283 A1 | 11/2018 | Bi et al. | |

* cited by examiner

CLOSELY PACKED VERTICAL TRANSISTORS WITH REDUCED CONTACT RESISTANCE

DOMESTIC PRIORITY

This application is a divisional of U.S. application Ser. No. 16/023,244, filed Jun. 29, 2018, titled "CLOSELY PACKED VERTICAL TRANSISTORS WITH REDUCED CONTACT RESISTANCE," which is a divisional of U.S. application Ser. No. 15/618,611, titled "CLOSELY PACKED VERTICAL TRANSISTORS WITH REDUCED CONTACT RESISTANCE," filed Jun. 9, 2017 (now, U.S. Pat. No. 10,096,695, issued Oct. 9, 2018), which is a divisional of U.S. application Ser. No. 15/248,355, titled "CLOSELY PACKED VERTICAL TRANSISTORS WITH REDUCED CONTACT RESISTANCE," filed Aug. 26, 2016 (now U.S. Pat. No. 9,735,253, issued Aug. 15, 2017), the contents of which are incorporated by reference herein in its entirety.

BACKGROUND

The present invention relates in general to semiconductor device fabrication methods and resulting structures. More specifically, the present invention relates to fabrication methods and resulting structures for a semiconductor device having closely packed vertical transistors with reduced contact resistance.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

SUMMARY

According to embodiments of the present invention, a method of fabricating a semiconductor device having closely packed vertical transistors with reduced contact resistance is provided. The method can include forming a semiconductor structure on a bottom doped region of a substrate, the semiconductor structure including a gate formed over a channel region of a semiconductor fin. A liner is formed on the gate and the semiconductor fin and a dielectric layer is formed on the liner. Portions of the liner are removed to expose a top surface and sidewalls of the semiconductor fin and a sidewall of the dielectric layer and a recessed opening is formed by recessing portions of the liner from the exposed sidewall of the dielectric layer. A top epitaxy region is formed on the exposed top surface and sidewalls of the semiconductor fin and the exposed sidewall of the dielectric layer, an extension of the top epitaxy region filling the recessed opening, said top epitaxy region confined between portions of the liner.

According to embodiments of the present invention, a method of fabricating a semiconductor device having closely packed vertical transistors with reduced contact resistance is provided. The method can include forming a semiconductor structure on a bottom doped region of a substrate, the semiconductor structure including a plurality of gates, each gate formed over a channel region of a semiconductor fin. A liner is formed on the semiconductor structure and a dielectric layer is formed on the liner. Portions of the liner are removed to expose a top surface and sidewalls of each semiconductor fin and a plurality of recessed openings are formed under the dielectric layer by recessing portions of the liner. A top epitaxy region is formed on the exposed top surface and sidewalls of each semiconductor fin, an extension of each top epitaxy region filling one of the plurality of recessed openings, portions of the liner preventing a short between adjacent top epitaxy regions.

According to embodiments of the present invention, a structure having closely packed vertical transistors with reduced contact resistance is provided. The structure can include a vertical semiconductor structure formed on a bottom doped region of a substrate, the semiconductor structure including a gate formed over a channel region of a semiconductor fin, the gate between a bottom spacer and a top spacer. A top epitaxy region is formed on a surface of the semiconductor fin and a surface of the top spacer. A first contact is formed contacting a surface of the bottom epitaxy region, said first contact prevented from electrically shorting to the gate by portions of a liner formed between the first contact and the semiconductor structure. A second contact is formed wrapping around a top surface and a sidewall of the top epitaxy region, said second contact prevented from electrically shorting to the gate by portions of the liner formed between the second contact and the semiconductor structure.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
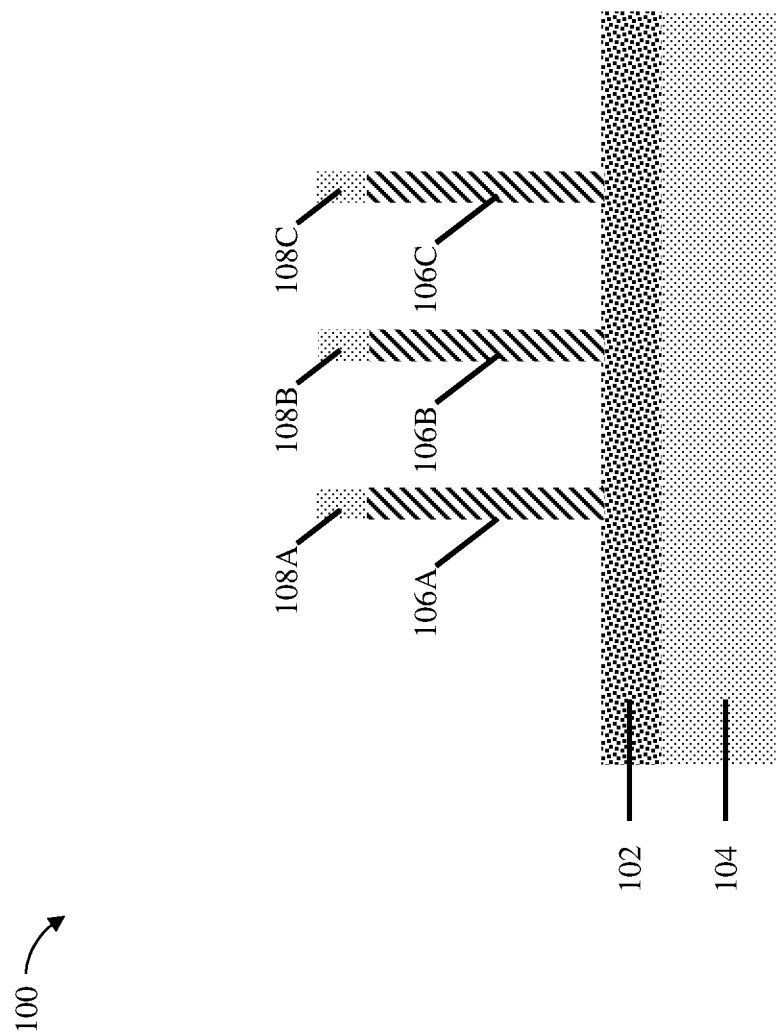
FIG. 1 depicts a cross-sectional view of a structure having a bottom doped region formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having closely packed vertical transistors with reduced contact resistance according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as VFETs, employ semiconductor fins and side-gates that can be contacted outside the active region, resulting in increased device density over lateral devices. However, there are challenges to providing VFETs with equal or superior performance characteristics to lateral devices. For example, reducing contact resistance is can improve the performance of VFETs, particularly for closely packed transistors having a tight fin pitch. Furthermore, as the features of a VFET are reduced in size and increased in aspect ratio, it can be increasingly difficult to prevent an electrical short between the bottom source/drain contact and the VFET gate. Thus, a method and structure is desired for reducing the contact resistance of closely packed VFETs while simultaneously preventing a short between the source/drain epitaxy and the metal gate of each VFET.

Turning now to an overview of aspects of the present invention, one or more embodiments provide methods of fabricating a semiconductor device having closely packed vertical transistors with reduced contact resistance. The described methods employ a wrap-around contact metal formed on all sides of the top source/drain epitaxy to increase the epitaxy contact area and reduce contact resistance. A dual-purpose nitride liner is used to confine the top epitaxy in a trench and to prevent an electrical short between the bottom source/drain contact and the metal gate. Methods for forming a wrap-around contact metal and a dual-purpose nitride liner and the resulting structures therefrom in accordance with embodiments of the present invention are described in detail below by referring to the accompanying drawings in FIGS. 1-11.

FIG. 1 illustrates a cross-sectional view of a structure 100 having a bottom doped region 102 formed on a substrate 104 during an intermediate operation of a method of fabricating a semiconductor device according to one or more embodiments. The bottom doped region 102 can be a source or drain region formed on the substrate 104 by a variety of methods, such as, for example, diffusion, ion implantation of a dopant into the substrate, or in-situ doped epitaxy. The substrate 104 can be any suitable substrate material, such as, for example, monocrystalline Si, SiGe, SiC, III-V compound semiconductor, II-VI compound semiconductor, or semiconductor-on-insulator (SOI). For ease of discussion, reference can be made to operations performed on and to a single semiconductor fin of the structure 100. It is understood that the structure 100 can include a plurality of semiconductor fins.

A semiconductor fin 106A having a hard mask 108A is formed on the bottom doped region 102 using known semiconductor fabrication techniques. For example, in some embodiments, a patterned hard mask (not illustrated) is etched to expose portions of the substrate 104. The exposed portions of the substrate 104 can be removed to form a plurality of semiconductor fins. The patterned hard mask is then removed using an etch process, which can be a wet etch process, a dry etch process or a combination thereof. The semiconductor fin 106A can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. The hard mask 108A can be any suitable material, such as, for example, a nitride or silicon nitride. In some embodiments, a plurality of semiconductor fins (i.e., 106A, 106B, and 106C) is formed on the bottom doped region 102. In some embodiments, the fin pitch, or spacing, between each semiconductor fin can be about 20 nm to about 100 nm. In other embodiments, the fin pitch is about 30 nm to about 50 nm.

Figure 2:
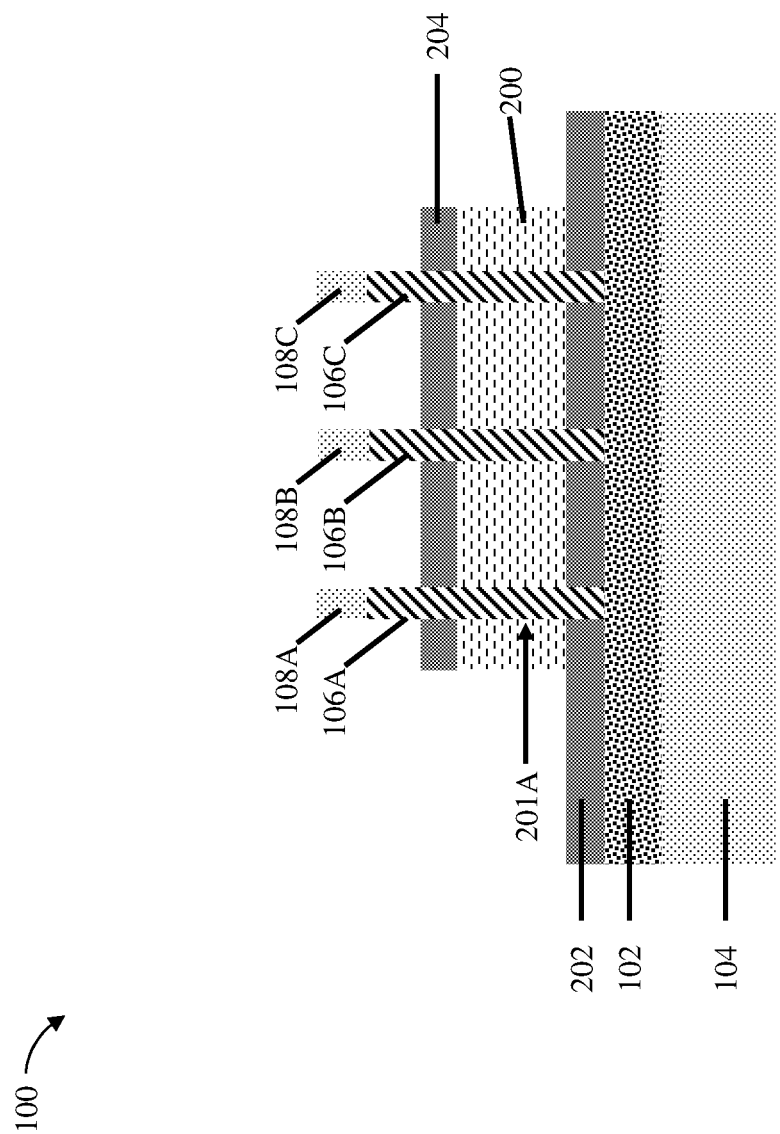
FIG. 2 depicts the cross-sectional view of the structure after forming a gate over a channel region of a semiconductor fin on the bottom doped region according to one or more embodiments of the present invention.

FIG. 2 illustrates a cross-sectional view of the structure 100 after forming a gate 200 over a channel region 201A of the semiconductor fin 106A on the bottom doped region 102. For clarity, only the channel region 201A is illustrated. It is understood that each semiconductor fin (e.g., 106B, 106C) also includes a channel region. In some embodiments, the gate 200 includes a gate dielectric (e.g., high-k dielectric) region defining a channel interface between the semiconductor fin 106A and the gate 200. In some embodiments, the gate dielectric region is formed between the gate 200 and the semiconductor fin 106A to modify the work function of the gate. Any known composition and manner of forming the gate 200 having a gate dielectric region can be utilized. The gate 200 (sometimes referred to as a gate conductor) can be made of, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The gate can further include a work function metal layer next to the gate dielectric region. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof, during an operation for forming a VFET, according to one or more embodiments.

The gate dielectric region can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric region can have a thickness of about 0.5 nm to about 4 nm. In other embodiments, the gate dielectric region can have a thickness of about 2 nm to about 3 nm.

In some embodiments, the gate 200 is formed between a bottom spacer 202 and a top spacer 204, wherein the bottom spacer 202 is formed on the bottom doped region 102. The bottom spacer 202 and the top spacer 204 can be any suitable material, such as, for example, a low-k dielectric, a nitride, silicon nitride (SiN), silicon oxygen carbonitride (SiOCN), or silicoboron carbonitride (SiBCN). In some embodiments, the bottom spacer 202 and top spacer 204 are different materials.

Figure 3:
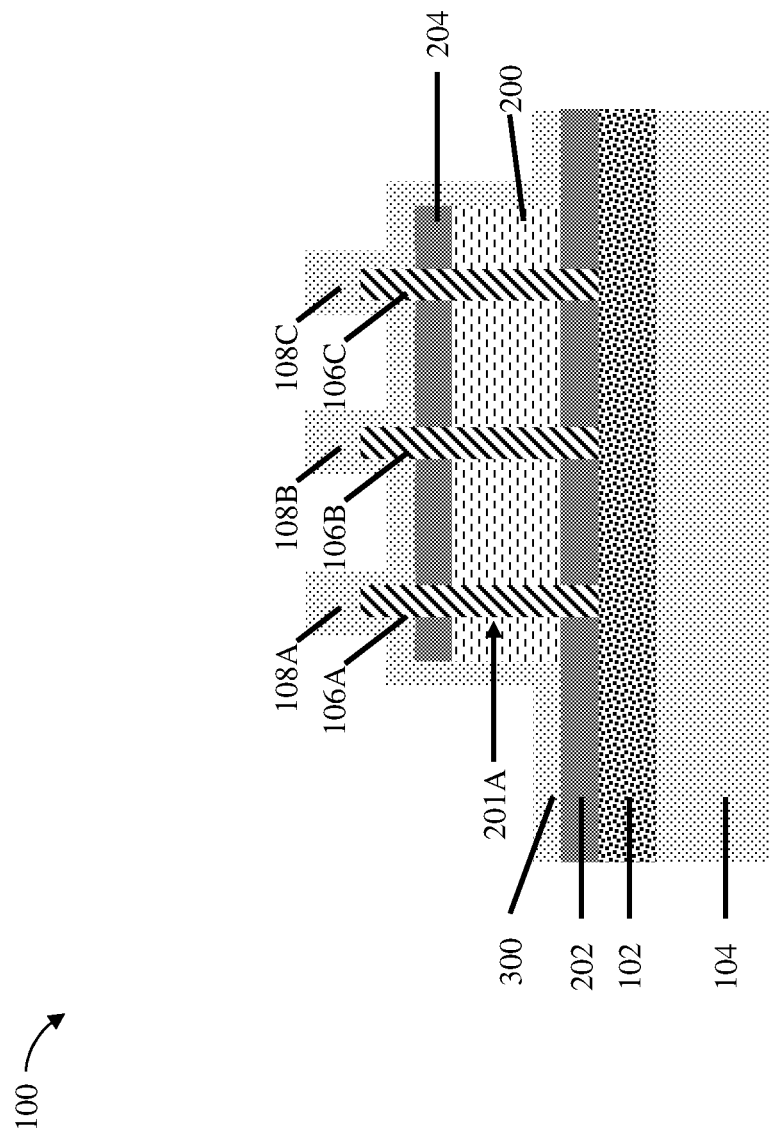
FIG. 3 depicts the cross-sectional view of the structure after forming a liner on the gate and the semiconductor fin according to one or more embodiments of the present invention.

FIG. 3 illustrates a cross-sectional view of the structure 100 after forming a liner 300 on the gate 200 and the semiconductor fin 106A. In one embodiment, the liner 300 is conformal ("conformal" as used herein means that the thickness of the liner 300 is substantially the same on all surfaces, or the thickness variation is less than 15% of the nominal thickness). The liner 300 can be any suitable material, such as, for example, a nitride, a silicon nitride, SiOC, SiOCN, or SiBCN. In some embodiments, the liner 300 is of the same material as the hard mask 108A. Any known composition and manner of forming the liner 300 can be utilized. In some embodiments, the liner 300 can be conformally formed using CVD, PECVD, atomic layer deposition (ALD), evaporation, physical vapor deposition (PVD), chemical solution deposition, or other like processes. In some embodiments, the liner 300 has a thickness of about 3 nm to about 20 nm. In other embodiments, the liner 300 has a thickness of about 3 nm to about 8 nm. In still other embodiments, the liner 300 has a thickness of about 5 nm.

Figure 4:
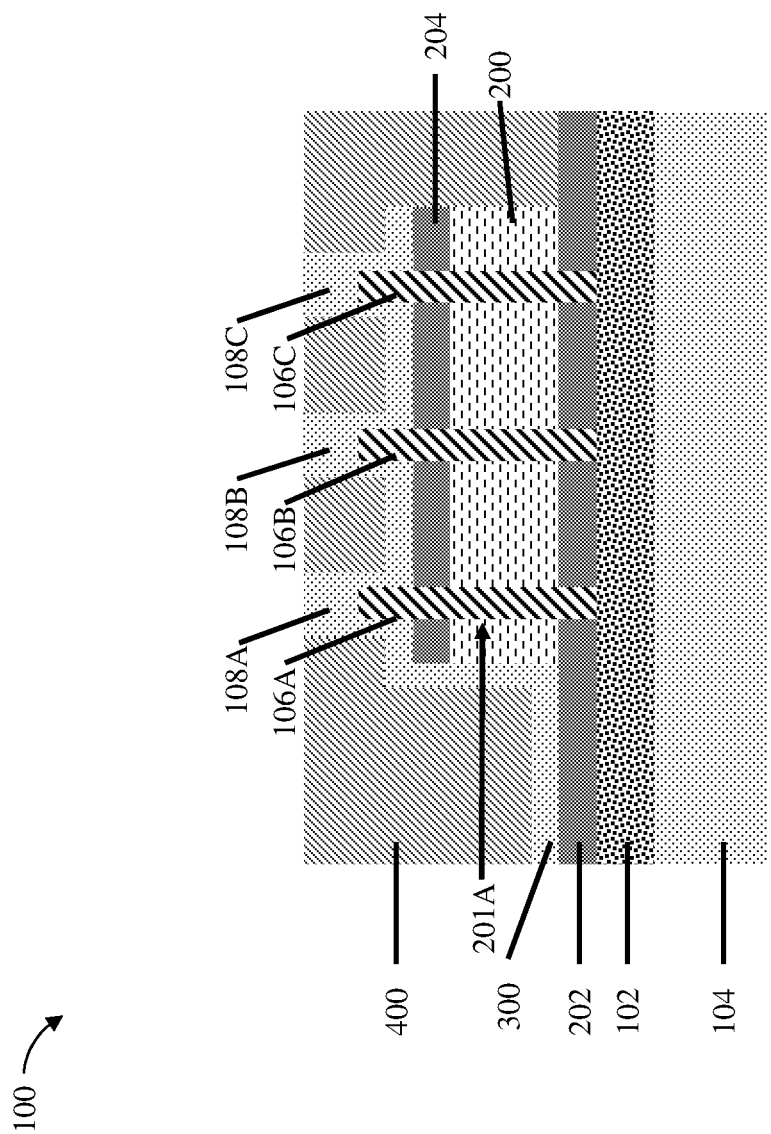
FIG. 4 depicts the cross-sectional view of the structure after forming a dielectric layer on the liner according to one or more embodiments of the present invention.

FIG. 4 illustrates a cross-sectional view of the structure 100 after forming a dielectric layer 400 on the liner 300. Any known composition and manner of forming the dielectric layer 400 can be utilized. In some embodiments, the dielectric layer 400 is deposited by a spin-on coating operation. In still other embodiments, a CMP selective to the liner 300 is used to remove any excess portion of the dielectric layer 400 (known as overburden) that extends above a top surface of the liner 300. The dielectric layer 400 can be any suitable material, such as, for example, an oxide. In some embodiments, the dielectric layer 400 is silicon oxide.

Figure 5:
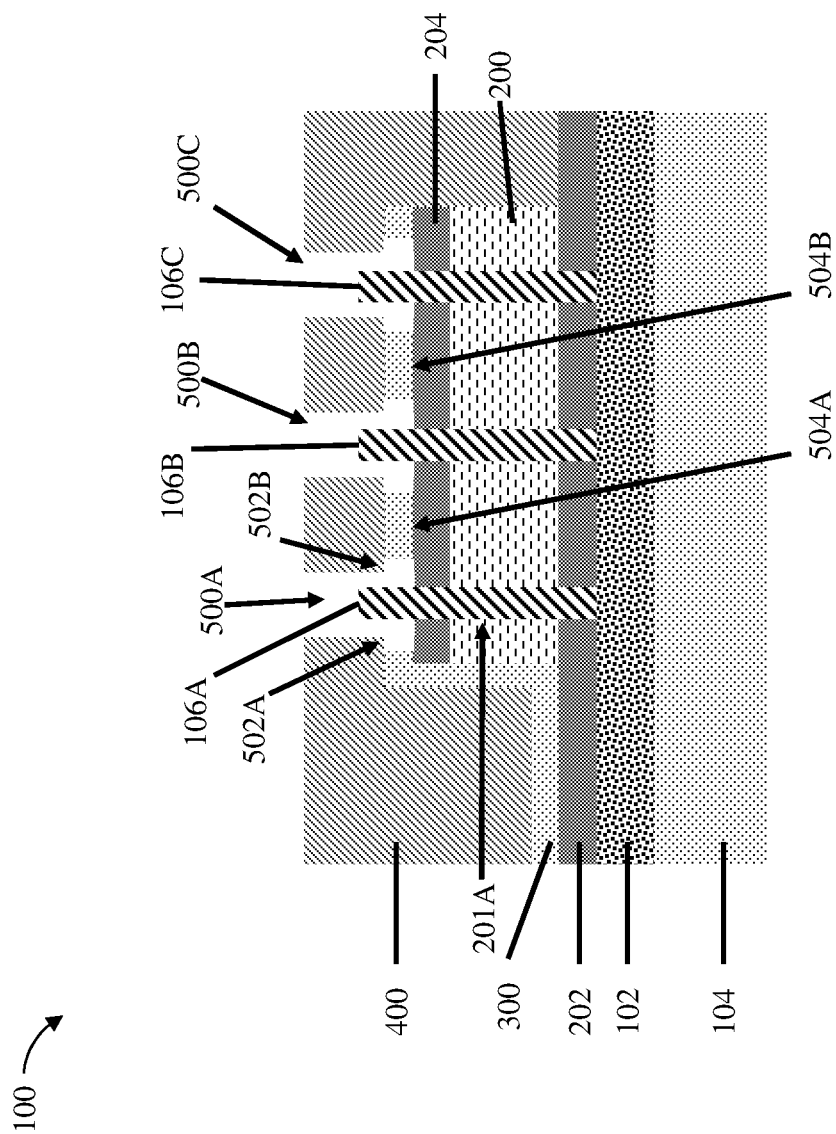
FIG. 5 depicts the cross-sectional view of the structure after removing a hard mask and portions of the liner to form an opening around the semiconductor fin according to one or more embodiments of the present invention.

FIG. 5 illustrates a cross-sectional view of the structure 100 after removing the hard mask 108A and portions of the liner 300 to form an opening 500A around the semiconductor fin 106A. The opening 500A exposes a top surface and sidewalls of the semiconductor fin 106A and sidewalls of the dielectric layer 400. The liner 300 is recessed horizontally from the exposed sidewalls of the dielectric layer 400 to form recessed openings 502A and 502B. For clarity, only recessed openings 502A and 502B are illustrated. It is understood that recessed openings are formed in like manner for each of the semiconductor fins (e.g., 106B, 106C). In some embodiments, portions of the liner 300 are removed to form a plurality of openings (i.e., openings 500A, 500B, and 500C), each opening exposing a top surface and sidewalls of one of a plurality of semiconductor fins (i.e., 106A, 106B, and 106C). After recessing portions of the liner 300, recessed portions (i.e., 504A and 504B) of the liner 300 remain to separate adjacent openings. Any known manner of removing the hard mask 108A and portions of the liner 300 can be utilized. In some embodiments, a directional etch, such as a RIE, selective to the dielectric layer 400 material is used to form the opening 500A.

Figure 6:
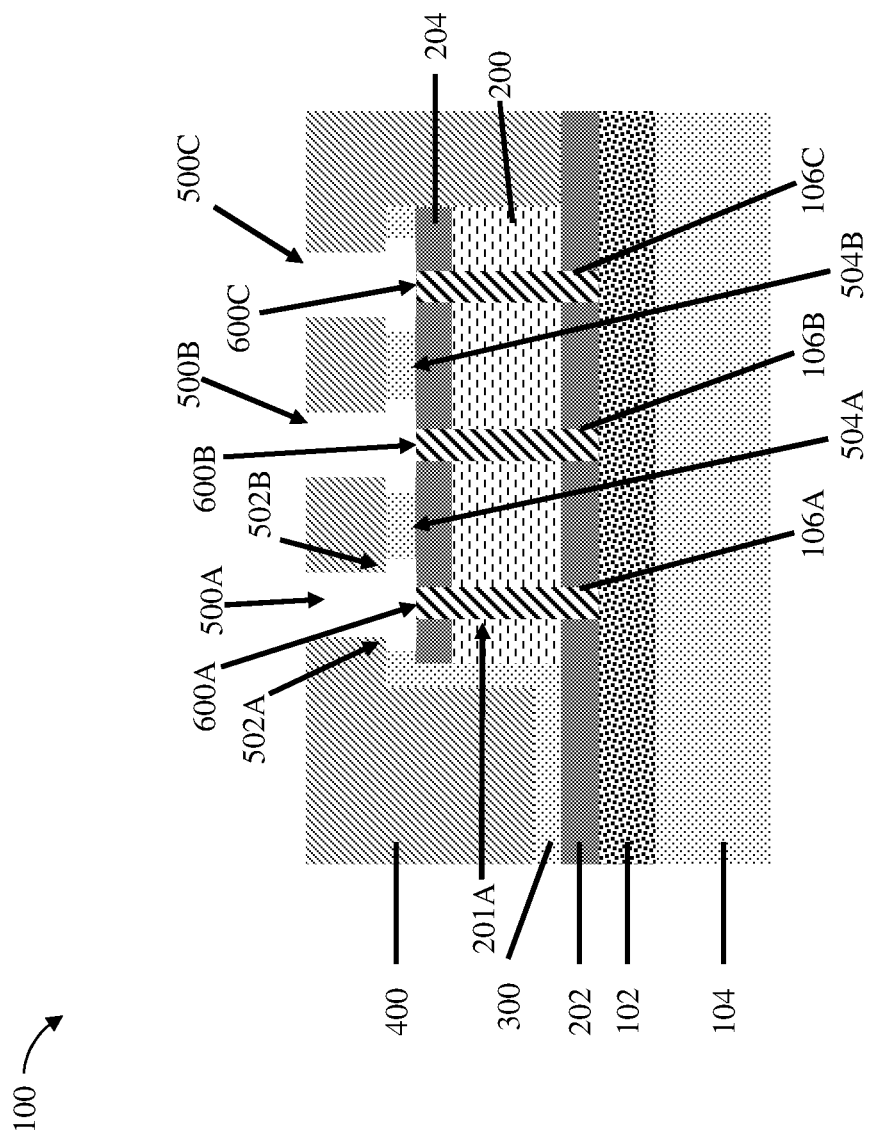
FIG. 6 depicts the cross-sectional view of the structure after recessing exposed portions of the semiconductor fin such that the recessed surface is flush with a surface of a top spacer according to one or more embodiments of the present invention.

FIG. 6 illustrates a cross-sectional view of the structure 100 after recessing the exposed portions of the semiconductor fin 106A such that the recessed surface 600A is flush with a surface of the top spacer 204. In some embodiments, the surface 600A is instead recessed slightly below the surface of the top spacer 204. In other embodiments, the surface 600A is instead slightly capped above the surface of the top spacer 204.

Figure 7:
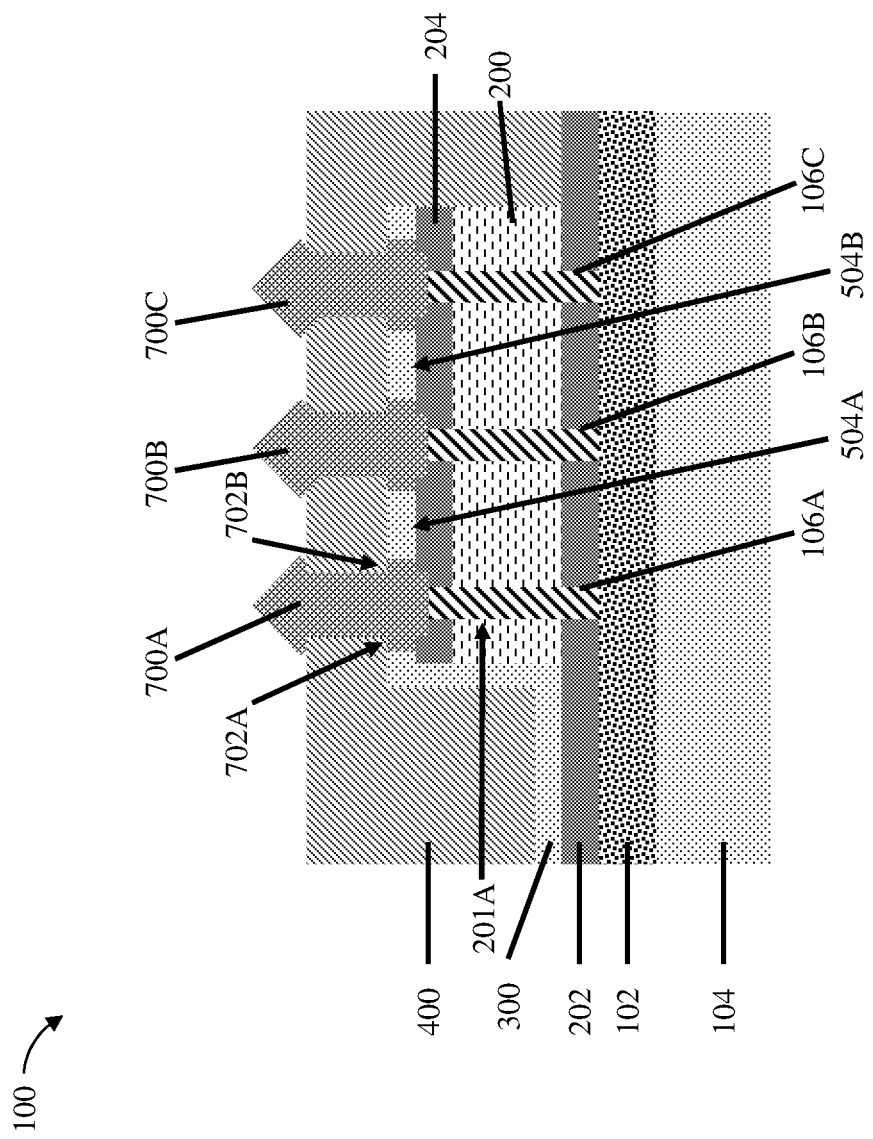
FIG. 7 depicts the cross-sectional view of the structure after forming a top epitaxy region on the exposed portions of the semiconductor fin and dielectric layer according to one or more embodiments of the present invention.

FIG. 7 illustrates a cross-sectional view of the structure 100 after forming a top epitaxy region 700A on the exposed portions of the semiconductor fin and dielectric layer to fill the opening 500A (depicted in FIG. 5). Extensions 702A and 702B of the top epitaxy region 700A fill the recessed openings 502A and 502B (depicted in FIG. 5). For clarity, only extensions 702A and 702B are illustrated. It is understood that extensions are formed for each semiconductor fin (e.g., 106B, 106C). In some embodiments, a plurality of top epitaxy regions (i.e., 700A, 700B, and 700C) is formed to fill a plurality of openings (500A, 500B, and 500C, depicted in FIG. 5). Recessed portions (i.e., 504A and 504B) of the liner 300 separate adjacent top epitaxy regions. Any known manner of forming the top epitaxy region 700A can be utilized. In some embodiments, epitaxial growth, CVD, ECD, MBE, or ALD is employed to form the top epitaxy region 700A. In some embodiments, the top epitaxy region 700 extends beyond a top surface of the dielectric layer 400. In some embodiments, the top epitaxy region 700 is in-situ doped. In some embodiments, the top epitaxy region 700 is formed using ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), or molecular beam epitaxy (MBE). Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm-3 to $2 \times 10^{21}$ cm$^{-3}$, or preferably between $2 \times 10^{20}$ cm$^{-3}$ to $1 \times 10^{21}$ cm$^{-3}$.

Figure 8:
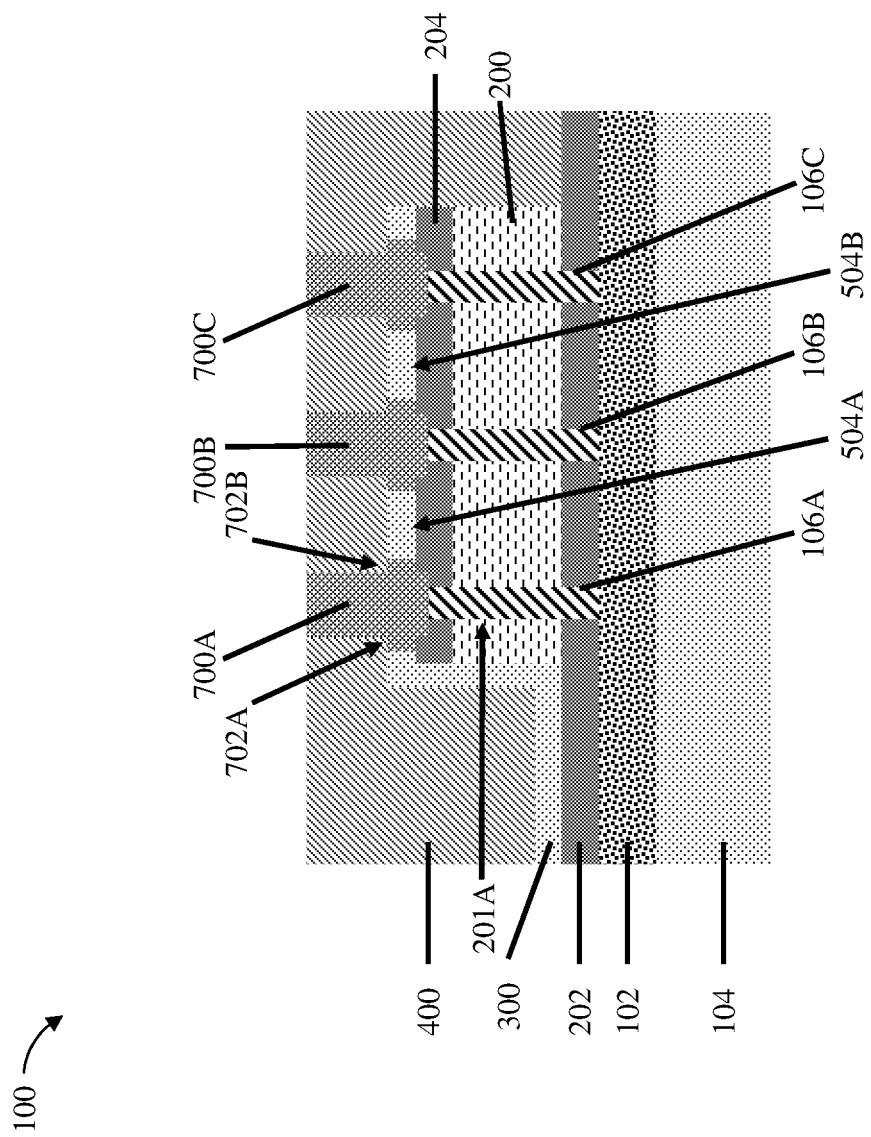
FIG. 8 depicts the cross-sectional view of the structure after planarizing the top epitaxy region to a surface of the dielectric layer according to one or more embodiments of the present invention.

FIG. 8 illustrates a cross-sectional view of the structure 100 after planarizing the top epitaxy region 700A to a surface of the dielectric layer 400. In some embodiments, a CMP selective to the dielectric layer 400 is used to remove any excess portion of the top epitaxy region 700A (known as overburden) that extends above the surface of the dielectric layer 400.

Figure 9:
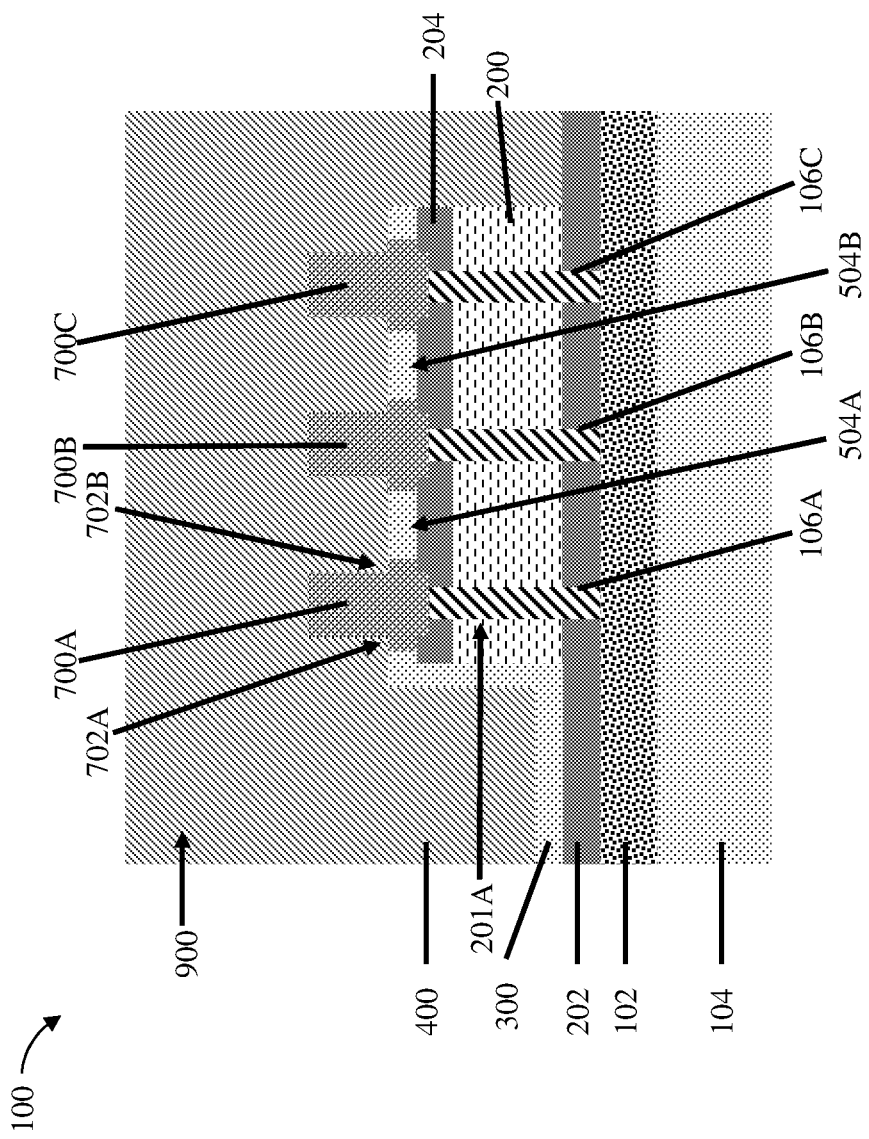
FIG. 9 depicts the cross-sectional view of the structure after forming an interlayer dielectric (ILD) on the dielectric layer and the top epitaxy region according to one or more embodiments of the present invention.

FIG. 9 illustrates a cross-sectional view of the structure 100 after forming an interlayer dielectric (ILD) 900 on the dielectric layer 400 and the top epitaxy region 700A. Any known manner of forming the ILD 900 can be utilized. In some embodiments, the ILD 900 is deposited by a spin-on coating operation. The ILD 900 can be any suitable material, such as, for example, an oxide. In some embodiments, the ILD 900 is silicon dioxide ($SiO_2$). In some embodiments, the ILD 900 is of the same material as the dielectric layer 400.

Figure 10:
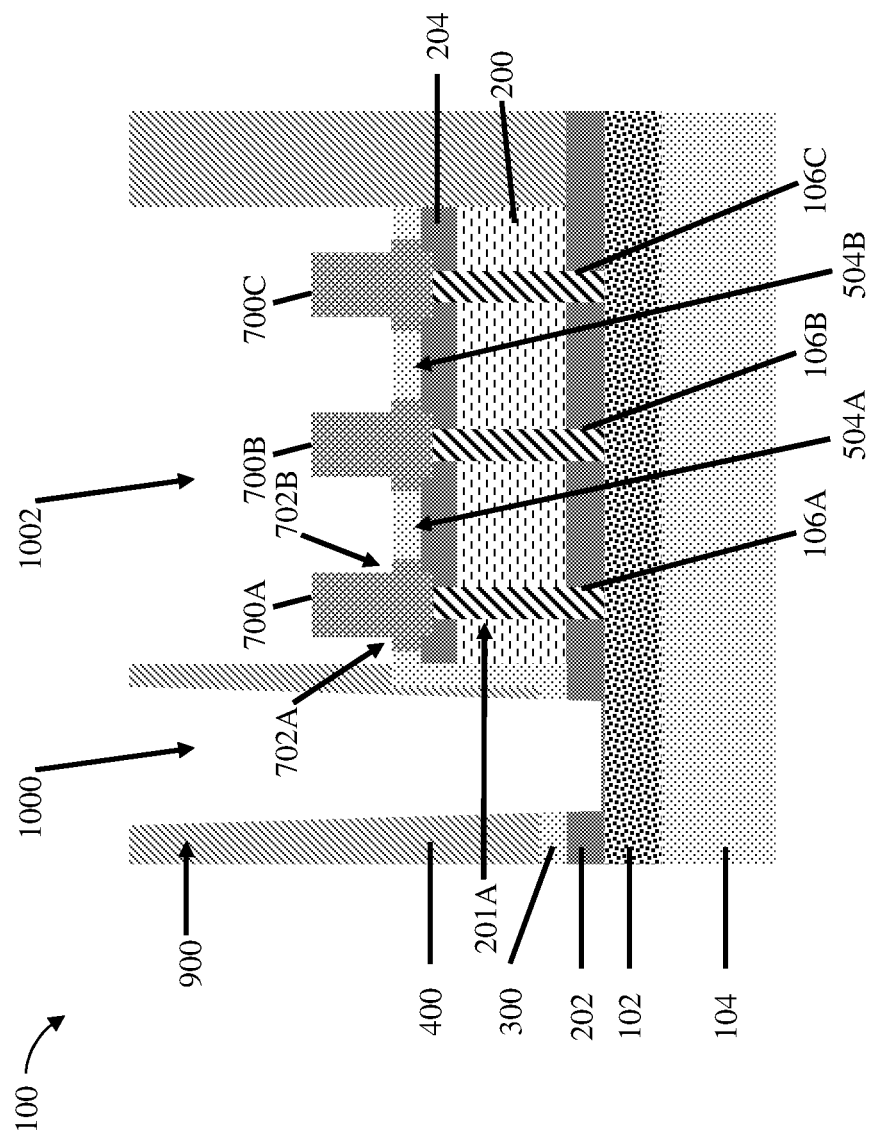
FIG. 10 depicts the cross-sectional view of the structure after forming a bottom contact trench and a top epitaxy trench according to one or more embodiments of the present invention.

FIG. 10 illustrates a cross-sectional view of the structure 100 after forming a bottom contact trench 1000 and a top epitaxy trench 1002. Any known manner of forming the bottom contact trench 1000 and top epitaxy trench 1002 can be utilized. In some embodiments, a patterned photomask is formed on the ILD 900. The patterned photomask exposes portions of the ILD 900 for selective removal. In some embodiments, the bottom contact trench 1000 is formed by a series of directional etches (e.g., RIEs). In some embodiments, a first RIE selective to the liner 300 removes exposed portions of the ILD 900 and dielectric layer 400 to expose a surface of the liner 300. In some embodiments, a subsequent RIE selective to the bottom doped region 102 material removes portions of the liner 300 and bottom spacer 202 to expose a surface of the bottom doped region 102. In some embodiments, the top epitaxy trench 1002 is formed by a RIE selective to the top epitaxy region 700A material and the liner 300 material. The RIE exposes a top surface, a sidewall, and the extensions (702A and 702B, depicted in FIG. 7) of the top epitaxy region 700A, as well as a surface of the recessed portions (i.e., 504A and 504B) of the liner 300.

Figure 11:
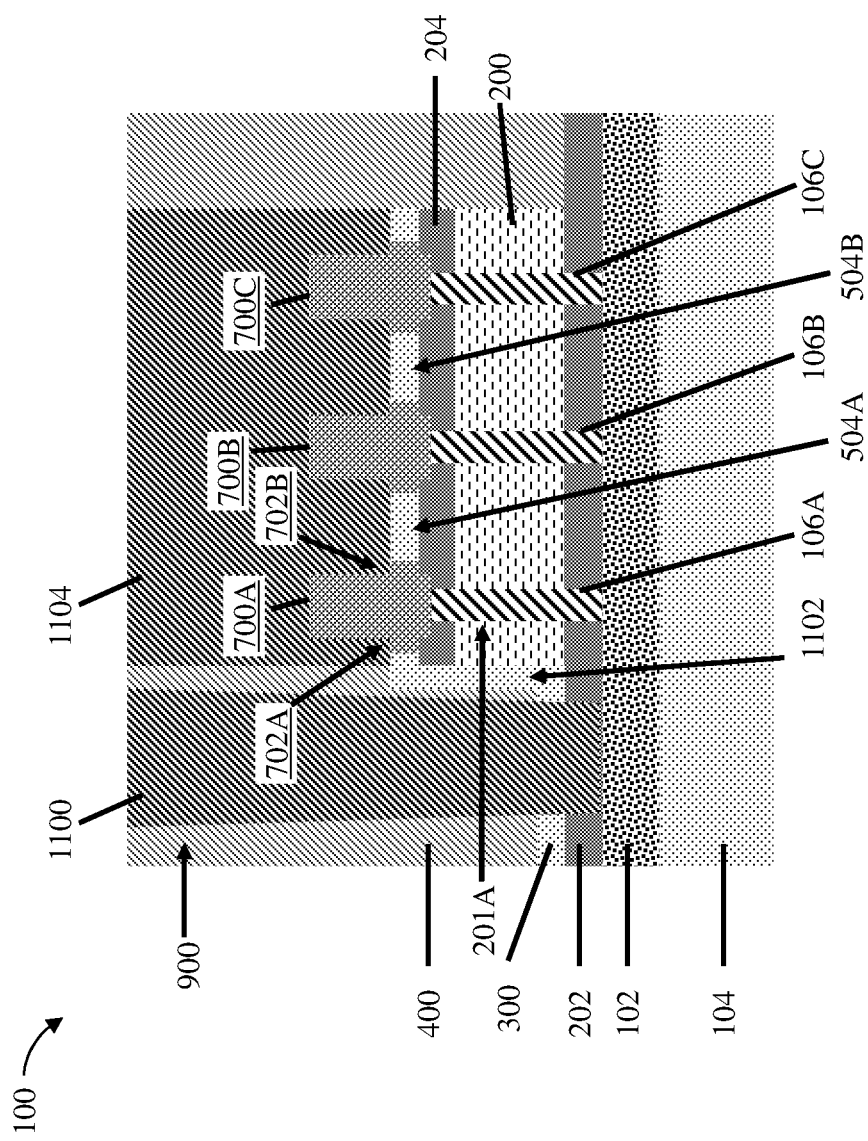
FIG. 11 depicts the cross-sectional view of the structure after forming a first contact in the bottom contact trench according to one or more embodiments of the present invention.

FIG. 11 illustrates a cross-sectional view of the structure 100 after forming a first contact 1100 in the bottom contact trench 1000 (depicted in FIG. 10). The first contact 1100 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. Any known manner of forming the first contact 1100 can be utilized. In some embodiments, the first contact 1100 can be copper and can include a barrier metal liner. In some embodiments, the barrier metal liner is deposited into the bottom contact trench 1000 prior to depositing the first contact 1100. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese. The first contact 1100 is prevented from shorting to the gate 200 by a sidewall portion 1102 of the liner 300.

A second contact 1104 is formed in the top epitaxy trench 1002 (depicted in FIG. 10). Any known manner of forming the second contact 1104 can be utilized. In some embodiments, the second contact 1104 can be copper and can include a barrier metal liner. The second contact 1104 wraps around the top epitaxy region 700A, contacting the top surface, sidewalls, and the extensions (702A and 702B, depicted in FIG. 7) of the top epitaxy region 700A. The second contact 1104 is prevented from shorting to the gate 200 by the liner 300 (including, for example, portions 504A and 504B of the liner 300).

In some embodiments, the first contact 1100 and the second contact 1104 are deposited into the bottom contact trench 1000 and the top epitaxy trench 1002, respectfully, each contact forming an overburden above a surface of the ILD 900. In some embodiments, a CMP selective to the ILD 900 removes the overburden of each contact.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for fabricating a semiconductor device, the method comprising:
    forming a vertical semiconductor structure on a bottom doped region of a substrate, the vertical semiconductor structure comprising a gate formed over a channel region of a semiconductor fin, the gate between a bottom spacer and a top spacer;
    forming a conformal liner on a surface of the bottom spacer, on a sidewall of the gate, and on a top surface of the top spacer;
    removing portions of the conformal liner to expose a top surface and sidewalls of the semiconductor fin;
    forming a top epitaxy region on the exposed top surface of the semiconductor fin and the top surface of the top spacer, the top epitaxy region confined between portions of the liner;
    forming a first contact on a surface of the bottom doped region, the first contact prevented from electrically shorting to the gate by portions of the liner formed between the first contact and the semiconductor structure; and
    forming a second contact wrapping around a top surface and a sidewall of the top epitaxy region, said second contact prevented from electrically shorting to the gate by portions of the liner formed between the second contact and the semiconductor structure.

2. The method of claim 1, wherein the semiconductor fin is recessed to a surface of the top spacer.

3. The method of claim 1, wherein the semiconductor fin is recessed below a surface of the top spacer.

4. The method of claim 1, wherein the vertical semiconductor structure comprises a plurality of gates, each gate formed over a channel region of a semiconductor fin.

5. The method of claim 4, further comprising a plurality of top epitaxy regions, each top epitaxy region formed on a surface of a semiconductor fin.

6. The method of claim 5, wherein portions of the liner prevent a short between adjacent top epitaxy regions.

7. The method of claim 1, wherein the liner has a thickness of about 3 nm to about 20 nm.

8. The method of claim 1, wherein the liner has a thickness of about 3 nm to about 8 nm.

9. The method of claim 1, wherein the liner comprises a nitride liner having a thickness of about 5 nm.

10. The method of claim 1, wherein a plurality of the semiconductor devices form a plurality of transistors.

11. The method of claim 10, wherein the plurality of transistors have a fin pitch of about 20 nm to about 100 nm.

12. The method of claim 1, wherein the first contact is comprised of copper and the second contact is comprised of copper.

13. A method for fabricating a semiconductor device, the method comprising:
 forming a semiconductor fin on a substrate;
 forming a gate over a channel region of the semiconductor fin, the gate between a bottom spacer and a top spacer;
 forming a liner over the semiconductor fin and the gate, the liner positioned on a surface of the bottom spacer, on a sidewall of the gate, and on a top surface of the top spacer;
 removing portions of the liner to expose a top surface and sidewalls of the semiconductor fin;
 forming a top epitaxy region on the exposed top surface of the semiconductor fin and the top surface of the top spacer, the top epitaxy region confined between sidewalls of the liner;
 forming a bottom source/drain contact, wherein the bottom source/drain contact is prevented from electrically shorting to the gate by a first portion of the liner; and
 forming a top source/drain contact, wherein the top source/drain contact is prevented from electrically shorting to the gate by a second portion of the liner.

14. The method of claim 13, wherein the top source/drain contact wraps around a top surface and a sidewall of the top epitaxy region.

15. The method of claim 13, wherein portions of the liner are recessed in a direction orthogonal to the channel region.

16. The method of claim 13, wherein the liner comprises a nitride liner having a thickness of about 3 nm to about 20 nm.

17. The method of claim 13, wherein a plurality of the semiconductor devices comprise a plurality of transistors.

18. The method of claim 17, wherein the plurality of transistors have a fin pitch of about 20 nm to about 100 nm.

19. The method of claim 17, wherein the plurality of transistors have a fin pitch of about 30 nm to about 50 nm.

20. The method of claim 13, wherein the bottom source/drain is comprised of copper and the top source/drain contact is comprised of copper.

* * * * *